United States Patent [19]
Weber

[11] Patent Number: 5,798,014
[45] Date of Patent: Aug. 25, 1998

[54] METHODS OF MAKING MULTI-TIER LAMINATE SUBSTRATES FOR ELECTRONIC DEVICE PACKAGING

[75] Inventor: Patrick O. Weber, San Jose, Calif.

[73] Assignee: Hestia Technologies, Inc., Sunnyvale, Calif.

[21] Appl. No.: 733,148

[22] Filed: Oct. 16, 1996

Related U.S. Application Data

[62] Division of Ser. No. 384,268, Feb. 2, 1995, Pat. No. 5,622,588.

[51] Int. Cl.$^6$ ............................................ H01L 23/12
[52] U.S. Cl. .................. 156/263; 29/830; 83/929.1; 156/150; 156/272.8; 174/52.4; 216/20
[58] Field of Search ................... 29/830; 83/929.1; 156/150, 263, 272.8; 174/52.4; 216/20

[56] References Cited

U.S. PATENT DOCUMENTS

| | | | |
|---|---|---|---|
| 3,364,087 | 1/1968 | Solomon et al. | 216/73 |
| 3,370,203 | 2/1968 | Kravitz et al. | 361/730 |
| 3,972,765 | 8/1976 | Kondo et al. | 156/315 |
| 4,101,693 | 7/1978 | Tsen et al. | 427/386 |
| 4,115,185 | 9/1978 | Carlson et al. | 216/20 |
| 4,211,603 | 7/1980 | Reed | 156/659.11 |
| 4,338,149 | 7/1982 | Quaschner | 156/248 |
| 4,446,188 | 5/1984 | Patel et al. | 428/138 |
| 4,522,667 | 6/1985 | Hanson et al. | 156/87 |
| 4,664,962 | 5/1987 | DesMarais, Jr. | 428/137 |
| 4,677,526 | 6/1987 | Muehling | 361/718 |
| 4,830,554 | 5/1989 | Lopez | 409/164 |
| 4,908,258 | 3/1990 | Hernandez | 428/198 |
| 4,929,370 | 5/1990 | Hatch et al. | 252/12.2 |
| 4,931,134 | 6/1990 | Hatkevitz et al. | 216/17 |
| 4,954,200 | 9/1990 | Trewiler | 216/36 X |
| 4,972,253 | 11/1990 | Palino et al. | 257/691 |
| 4,975,765 | 12/1990 | Ackermann et al. | 257/737 |
| 5,014,418 | 5/1991 | Wright | 29/827 |
| 5,089,878 | 2/1992 | Lee | 257/664 |
| 5,094,969 | 3/1992 | Warren | 437/51 |
| 5,191,511 | 3/1993 | Sawaya | 361/703 |
| 5,206,188 | 4/1993 | Hiroi et al. | 28/827 X |
| 5,256,474 | 10/1993 | Johnston | 428/220 |

FOREIGN PATENT DOCUMENTS

| | | |
|---|---|---|
| H5-41039 | 7/1987 | Japan . |
| H2-J014 | 9/1987 | Japan . |
| H4-55535 | 10/1987 | Japan . |

Primary Examiner—Francis J. Lorin
Attorney, Agent, or Firm—Burns, Doane, Swecker & Mathis, L.L.P.

[57] ABSTRACT

A method for making multi-tier laminate substrates for electronic device packaging is provided wherein a spacing mechanism is used to protect the bond fingers of a trace on a lower tier of the laminated substrate when a milling bit is used to cut an opening above a die cavity in the multi-tier substrate.

15 Claims, 5 Drawing Sheets

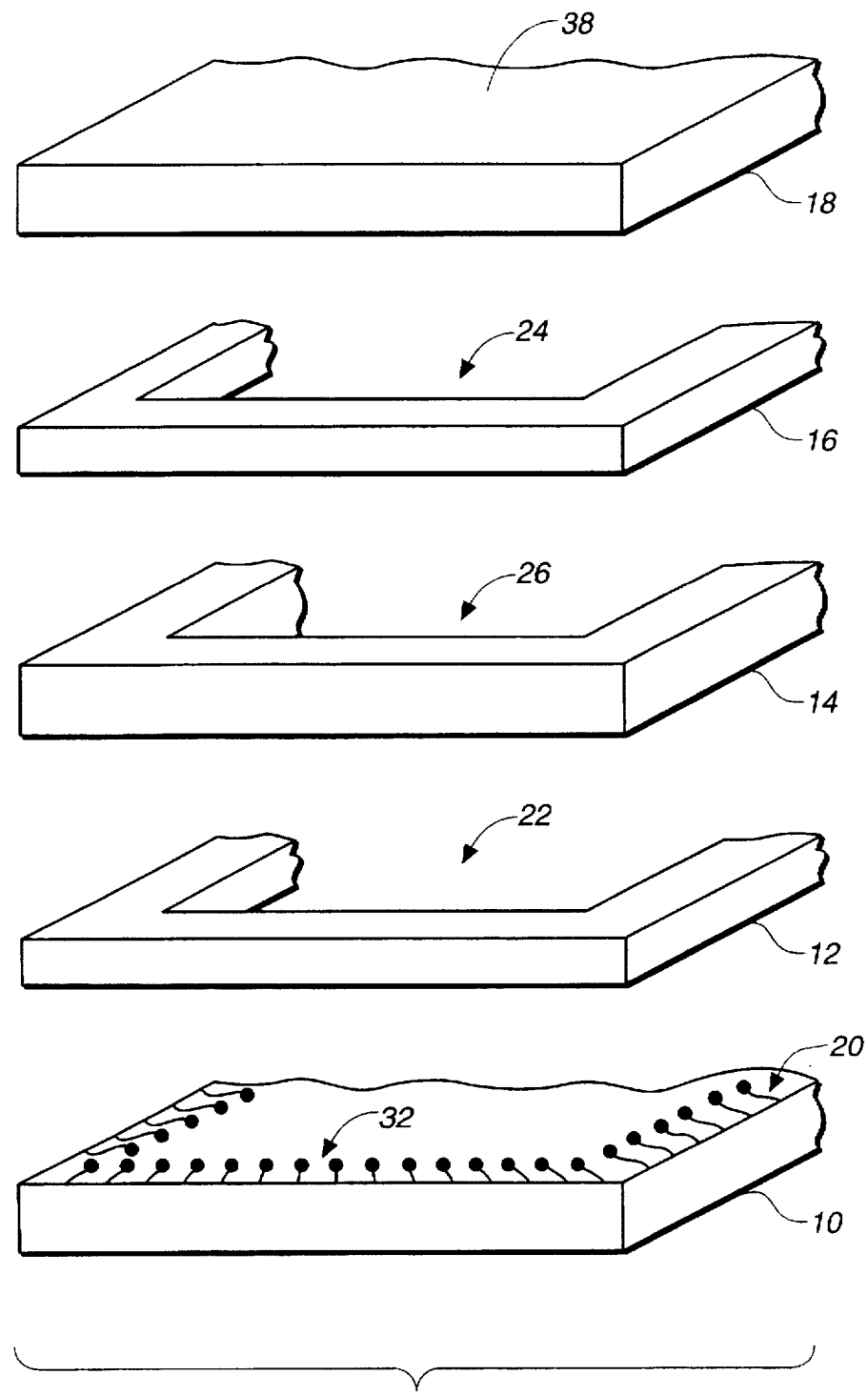
FIG._1

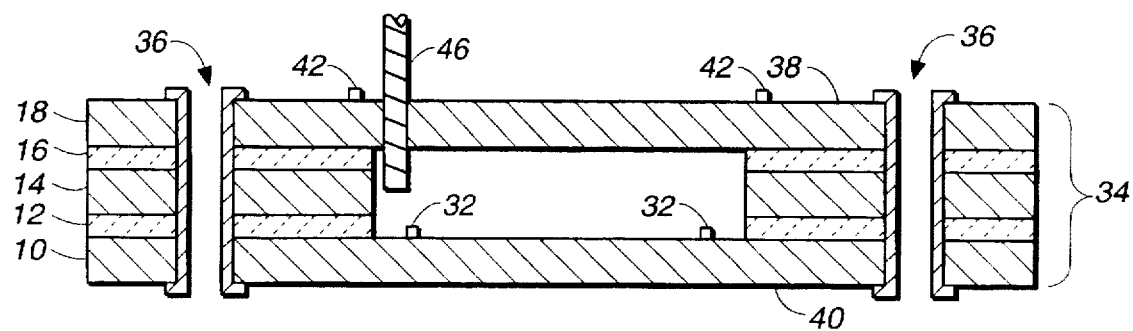
FIG._2
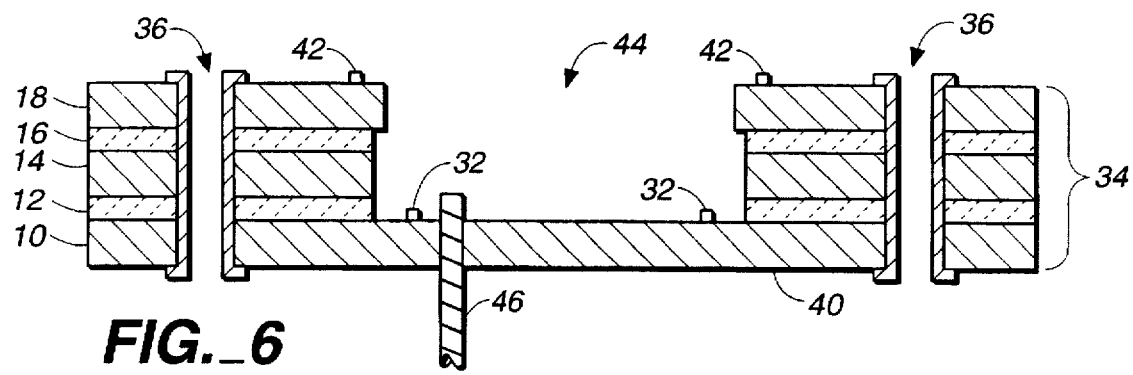
FIG._6
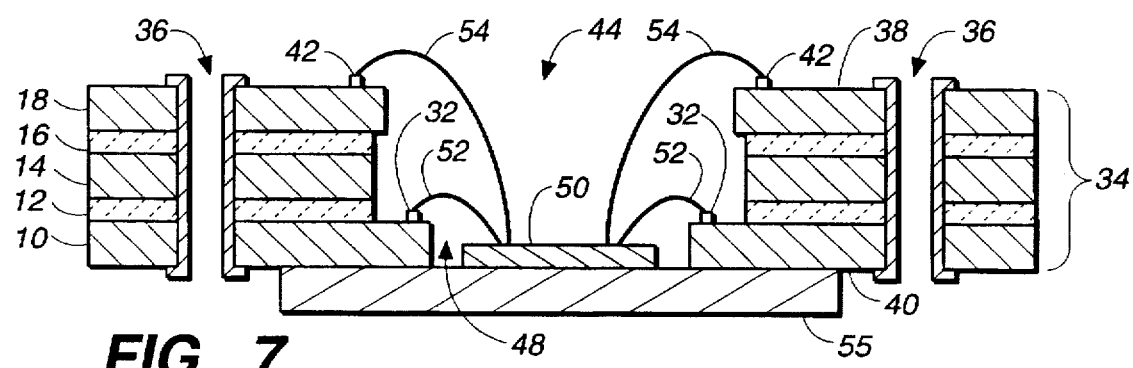
FIG._7
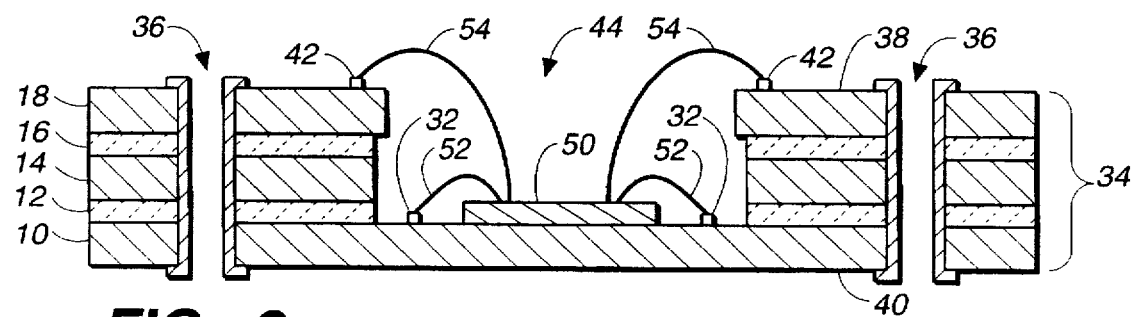
FIG._8

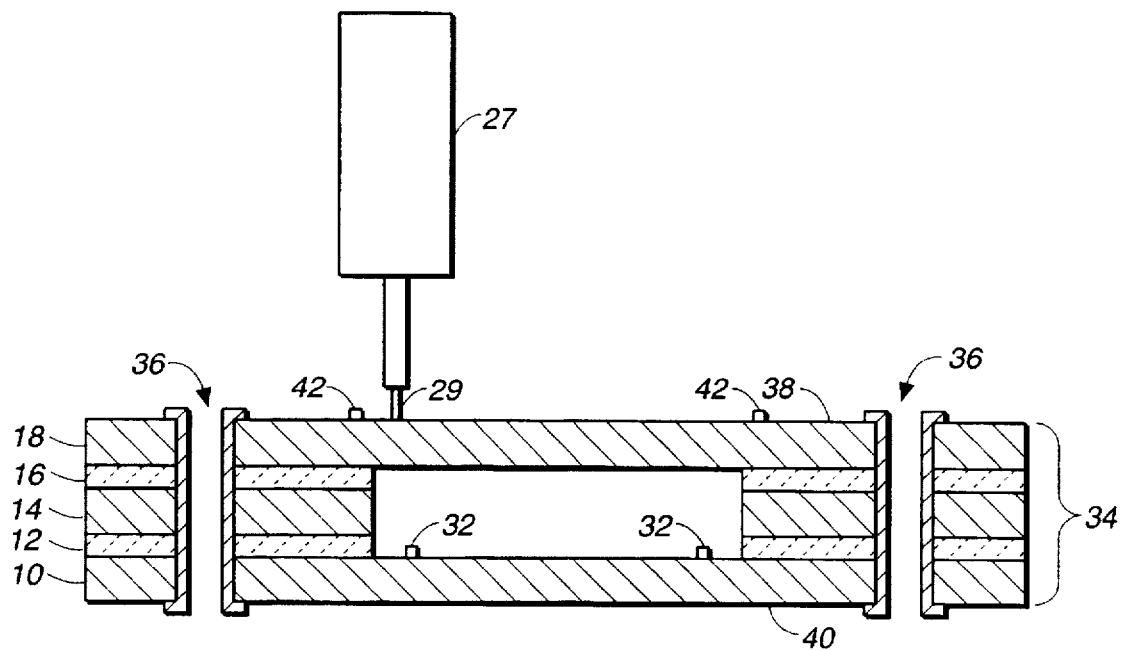
FIG._3
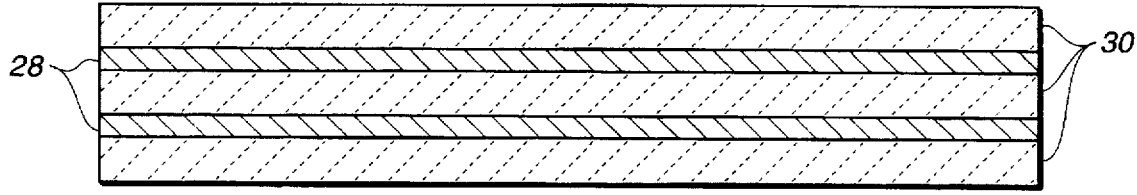
FIG._4
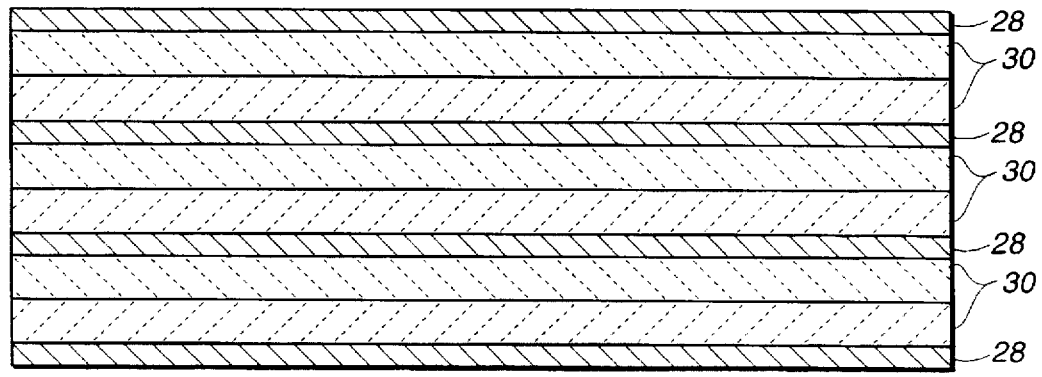
FIG._5

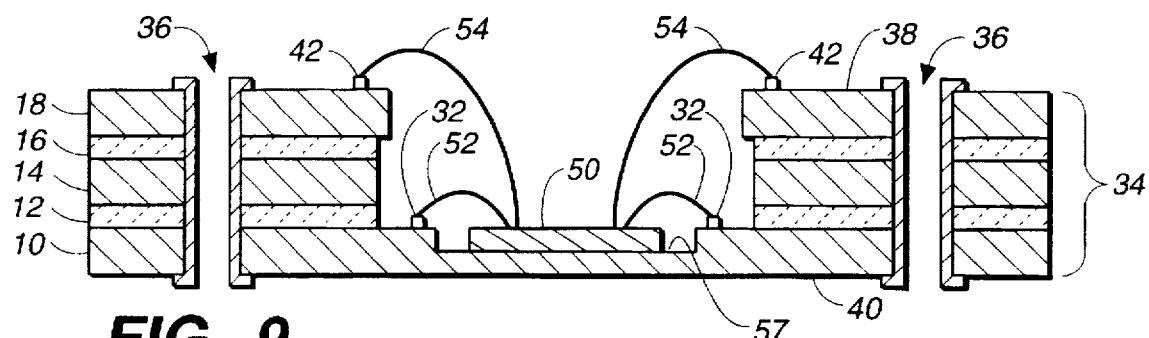
FIG._9
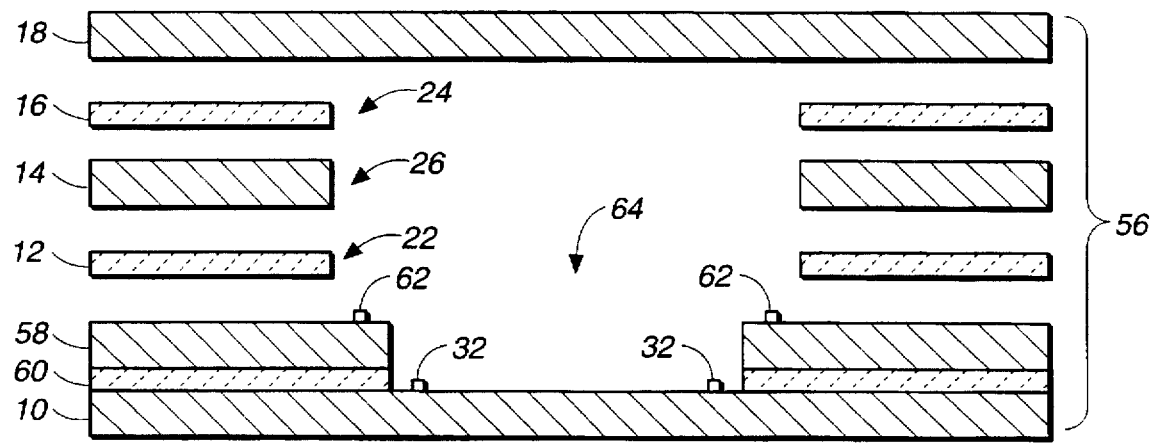
FIG._10
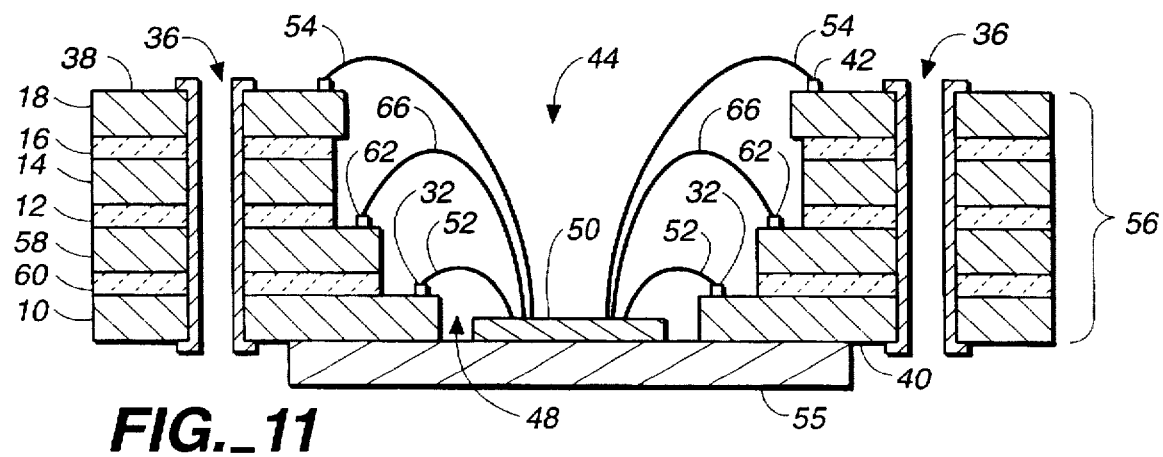
FIG._11

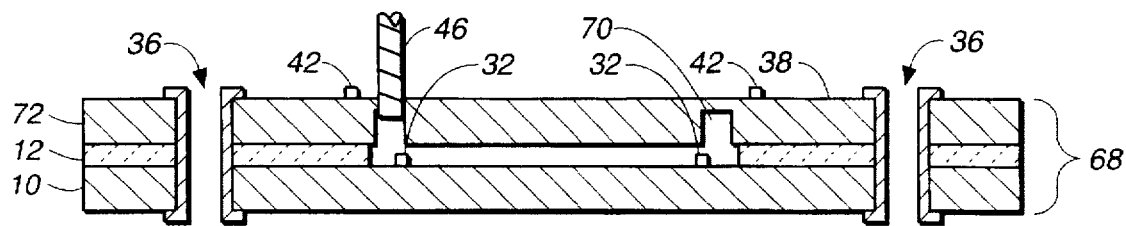
FIG._12
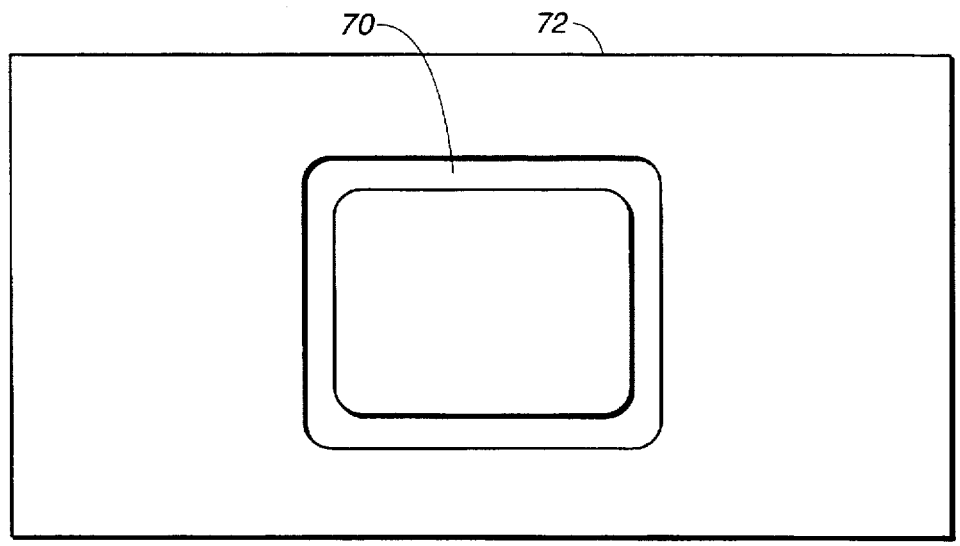
FIG._13
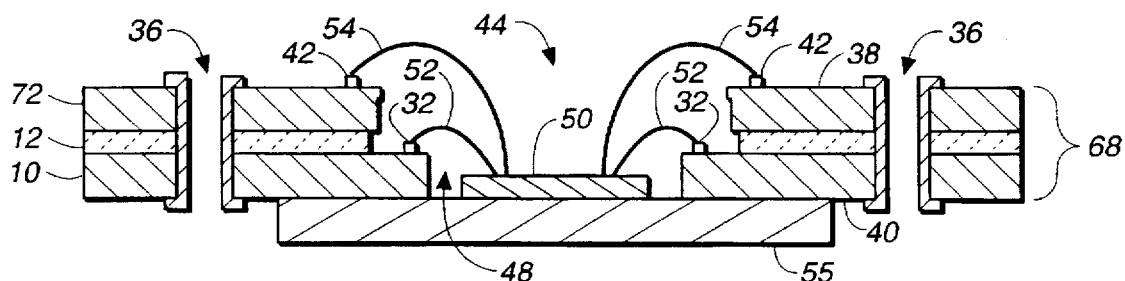
FIG._14

METHODS OF MAKING MULTI-TIER LAMINATE SUBSTRATES FOR ELECTRONIC DEVICE PACKAGING

This application is a divisional of application Ser. No. 08/384,268, filed Feb. 2, 1995, now U.S. Pat. No. 5,622,588.

FIELD OF THE INVENTION

The present invention relates to packaging for semiconductor devices, particularly to multi-tier electronic device packages, more particularly to multi-tier laminate substrates for integrated circuit packaging.

BACKGROUND OF THE INVENTION

In the fabrication of semiconductor devices there is an on-going need to reduce packaging costs and improve the electrical and thermal performance of the packages. Package sizing is also important, especially the profile or height of the package, when mounted to a printed wiring board or printed circuit board. Complicating the situation is the increasing complexity of electronic components such as integrated circuits which require a high pin count package to electrically connect the device to a user system.

Electronic circuits for complex systems such as digital computers typically are comprised of a multiplicity of interconnected integrated circuit chips. The integrated circuit chips are made from a semiconductor material such as silicon or gallium arsenide, and microscopic circuits are formed on the top surface of the chips by photolithographic techniques. In a conventional form of construction, the integrated circuit chips are mounted in respective ceramic packages, and the ceramic packages are mounted on a printed wiring board or printed circuit board. The majority of the ceramic packages are co-fired ceramic packages that are formed by overlaying multiple layers of ceramic in their green state and then simultaneously firing the layers to form a monolithic body. The ceramic packages have numerous external pins which are mechanically attached by solder or socket to conductor patterns printed on a printed circuit board.

Each ceramic package has a central cavity receiving an integrated circuit chip, and a set of conductors called leads connecting the external pins to the integrated circuit chip. Typically the leads are provided by a thick film conductor pattern deposited on a ceramic layer of the package. The conductor pattern includes a number of bonding areas spaced around the central cavity of the package. When an integrated circuit is received in the central cavity, the bonding areas align with respective bonding pads formed in metallization layers on the surface of the integrated circuit chip. The bonding areas of the package are connected to the bonding pads on the chip by thin flexible segments of bonding wire or metal tape that are bonded by thermocompression or thermosonic bonding to the bonding areas and pads.

With processor speeds moving through 100 MHz and continually upward, the relatively high dielectric constant of alumina ceramic used in ceramic packages is becoming difficult to deal with in terms of semiconductor packaging. Likewise, the relatively high resistivity of the tungsten conductor of the ceramic substrate causes significant design problems. Plastic integrated circuit packages have evolved as a cost effective replacement for ceramic packages. Modern laminate based molded packages offer electrical, thermal and design performance that matches and often times exceeds that of ceramic packages at a lower cost.

Electrically, laminate substrates have a clear advantage over co-fire ceramic with both lower resistance wiring and lower dielectric constant. Essentially, electrical designs can be implemented in less than half the volume (and half the number of layers) as an equivalent ceramic based design. Laminate based packages offer design flexibility, in terms of electrical design and final package configuration that is unsurpassed by any other packaging technology. The ability to use the substrate as the basis of the package, in virtually any form factor, increases the cost effectiveness of the technology. The ability to fit a laminate substrate into virtually any enclosure allows for any level of environmental protection necessary. Along with high electrical performance and high density wiring capability, laminate based packages have thermal expansion characteristics that match those of printed circuit boards very closely. This thermal expansion match is important for preventing thermally induced stress that can quickly fatigue solder joints and stress both the package and the board. There is a continuing need for a cost-effective, improved method for producing laminate based packages.

SUMMARY OF THE INVENTION

The present invention is a novel process for forming electronic device packages based on laminate substrates. Using a substrate as the basis for molded packages has resulted in very high wiring densities and fine geometries in the die cavity. The process also produces substrates suitable for multiple tier bonding in plastic packages and in plastic multiple chip modules.

In accordance with one embodiment of the present invention, a method is provided wherein a spacing layer is used to protect the bond fingers of a circuit on a lower layer of the substrate when a milling bit is used to cut an opening above a die cavity in the substrate.

In accordance with another embodiment of the present invention, a clearance ring is routed in the bottom surface of the top layer of the substrate prior to lamination. After lamination, a milling bit is traced along the path of the clearance ring to cut an opening above a die cavity in the substrate without damaging a circuit on a lower layer with the milling bit.

In accordance with yet another embodiment of the invention, a method is provided for shaping multiple layers of no-flow or low flow prepreg with a milling bit by using a removable film interposed between layers that are desired to be separated after shaping. The film assists in preventing the milling bit from becoming clogged with the prepreg as the prepreg heats up due to contact with the rotating bit and in reducing the roughness of the edge of the prepreg where the milling bit has contacted the prepreg. In addition, the film prevents the prepreg layers from sticking together when it is desired to separate them.

In accordance with another embodiment of the invention, there is provided a method for making multi-tier laminate substrates for electronic device packaging comprising the steps of providing a first laminating layer having a trace on a first side and a second laminating layer having a trace on a first side, making a first window in a spacer laminating layer, making a second window corresponding to the first window in at least one layer of dielectric, making a third window corresponding to the first window in at least one layer of dielectric, laminating together the first laminating layer, the second laminating layer, the spacer laminating layer, and the layers of dielectric to produce a laminated substrate, wherein one layer of the dielectric is located between the trace on the first side of the first laminating layer and a first side of the spacer laminating layer and one layer of the dielectric is located between the trace on the first side of the second laminating layer and a second side of the spacer laminating layer, making vias through the laminated substrate, plating the vias, producing traces on a second side of the first laminating layer and a second side of the second laminating layer, making a first opening in the first laminating layer corresponding to the second window, and treating exposed surfaces of the laminating layers.

In accordance with another embodiment of this invention, there is provided a method for making multi-tier laminate substrates for electronic device packaging comprising the steps of providing a first laminating layer having a trace on a first side and a second laminating layer having a trace on a first side, making an annular depression in the first side of the first laminating layer, making a first window corresponding to the annular depression in at least one layer of dielectric, laminating together the first laminating layer, the second laminating layer, and the layer of dielectric to produce a laminated substrate, wherein the layer of dielectric is located between the trace on the first side of the first laminating layer and the trace on the first side of the second laminating layer, making vias through the laminated substrate, plating the vias, producing traces on a second side of the first laminating layer and a second side of the second laminating layer, making a first opening in the first laminating layer corresponding to the annular depression, and treating exposed surfaces of the laminating layers.

In accordance with another embodiment of the invention, there is provided a method for shaping no-flow or low flow prepreg comprising routing at least two panels of no-flow or low flow prepreg with a film interposed between the panels, wherein the film assists in preventing rough edges on the panels created by a bit, in preventing the panels from sticking together, and in preventing the bit from clogging with the prepreg.

DEFINITIONS

CHIP or DIE—a chip of semiconducting material including an integrated circuit.

PAD—a metallization area placed near the chip's edge to which external wires are bonded.

BOND FINGERS—a metallization area placed near the edge of a trace to which the opposite end of the external wires are bonded to form an electrical connection between the chip and the trace.

TRACE—a horizontal metallization geometry which provides an electrical connection between a bond finger and a via, a via and a via, a via and a solder pad, a via and an electrical connector, etc.

VIA—a vertical metallization geometry which provides an electrical connection between traces on horizontal conductive layers.

PREPREG or STANDARD FLOW PREPREG—fiberglass or other fabric which has been saturated with polymer resin and partially cured (or B-staged). Typically having 25% to 45% resin flow as defined by MIL-P-13949F and a gel time of about 100 to 120 seconds.

NO-FLOW PREPREG or LOW FLOW PREPREG—prepreg having 1% to 4% resin flow as defined by MIL-P-13949F and usually no gel time. The terms "no-flow" and "low flow" prepreg are used throughout the specification and claims either together or alone but it should be understood that they refer to essentially the same material depending on whether the prepreg has 1% resin flow up to 4% resin flow.

The resin flow percentage is determined using the test specified in MILP-13949F. Bias cut 4 plys of prepreg 4±0.01 inches on a side. Desiccate any moisture that has been absorbed by the prepreg. Determine weight within 0.005 grams. Stack all of the squares with the grain of the cloth aligned in the same direction, and place between two ⅛ inch thick steel caul plates maintained at room temperature. Place the specimen and plates in a press at 171° C.±2.8° C. (340° F.±5° F.) and immediately apply 200±25 pounds per square inch for a minimum of 10 minutes. Remove the specimen from the press and cool to room temperature. Die cut a circular section 3.192±0.010 inches in diameter from the center of the specimen. The circular section shall be weighed to the nearest 0.005 grams and the result recorded. The percent resin flow shall be determined from the following formula:

$$\text{Resin flow (percent)} = \frac{W_B - 2W_C}{W_B} \times 100$$

Where $W_B$=Total weight of specimen before heat and pressure.

$W_C$=Weight of central cut-out after heat and pressure treatment.

The gel time is determined using the test specified in MIL-P-13949F. Extract dry resin from prepreg (B-stage) by folding or crushing. Allow B-stage resin to fall onto a smooth clean sheet of polyester film such as Mylar or equivalent. Pour collected resin through number 60 mesh wire sieve onto another sheet of film. Carefully weigh 200±20 milligrams of the resin onto a 3 inch by 3 inch sheet of clean waxed paper. Set temperature of cure plate (platen, hot plate, or melting point apparatus) to 171° C.±0.5° C. on the surface. Make sure that all resin residue from any previous test has been scraped from the surface of the cure plate. Lubricate the surface of the cure plate with montan wax (or other suitable mold release agent). Wipe surface clean—free of visible mold release agent—with a clean paper towel. Pour the 200 milligram sample of resin on the center of the cure plate. Start a stop watch immediately. Place the tapered end of a round toothpick against the surface of the cure plate (end of toothpick not in contact with surface of cure plate will have to be elevated slightly). Roll toothpick back and forth, maintaining contact with surface of cure plate until 20 seconds have elapsed. At this time start stroking the resin immediately, using a circular motion ⅛ inch to ½ inch in diameter. Stroke in such a manner that every circle moves part of the resin from center of the pool to the outside, and part of the resin from the outside of the pool toward the center. Care should be taken to limit the pool size to an area ¾ inch to ⅞ inch in diameter. Keep the toothpick in contact with resin and surface of the cure plate at all times. As the resin becomes stiff, it will not be possible to continue exchanging outside resin with inside resin, but continue stroking with as much exchange as possible without breaking the toothpick. If resin breaks up, continue stroking the largest piece. If this piece breaks up, continue stroking the largest remaining piece of this portion even though now a larger piece of the original pool may be present at some other place on the hot plate. When the stroked pieces separates from the hot plate, stop the watch. This is the end-point, and the total elapsed time is the gel time.

CORE—layers or sheets of standard flow prepreg stacked and pressed or laminated together to form a core with desired thickness. A core may have copper foil on the outside surfaces. A core may be referred to as a layer in the description and claims relating to the multi-tier laminate substrate.

DIELECTRIC—an adhesive layer made from no-flow or low flow prepreg film-coated with B-staged adhesive or unsupported B-staged film. Unsupported B-staged film is pure adhesive resin, there is no fiberglass or film that carries the adhesive resin.

MILL OR MILLING—produce a furrow in the surface of a layer of substrate or cut through a layer (or core) with a milling bit, being concerned with the x, y, and z settings and movements of the milling bit. One of ordinary skill in the art will recognize that milling refers to cutting or shaping with depth or z control.

ROUT OR ROUTING—cut through or shape a layer of substrate with a milling (or routing) bit, being concerned with the x and y settings and movements of the milling bit. One of ordinary skill in the art will recognize that routing refers to cutting or shaping without being concerned with depth or z control.

BRIEF DESCRIPTION OF THE DRAWING

Many objects and advantages of the present invention will be apparent to those of ordinary skill in the art when this specification is read in conjunction with the attached drawings wherein like reference numerals are applied to like elements and wherein:

FIG. 1 is an exploded view of the layers used to construct a multi-tier laminate substrate in accordance with one embodiment of the present invention;

FIG. 2 is a sectional view of the layers of FIG. 1 after being laminated together with a milling bit shown that is used to make a window in the top of the laminate substrate;

FIG. 3 is a sectional view of the layers of FIG. 1 after being laminated together with a laser shown that is used to make a window in the top of the laminate substrate;

FIG. 4 is a sectional view of layers of dielectric which are used to construct the laminate substrate of the present invention with layers of film interposed therebetween so that multiple layers of dielectric can be milled at the same time;

FIG. 5 is a sectional view of two layers of dielectric between each layer of film for the same purposes as FIG. 4;

FIG. 6 is a sectional view of the layers of FIG. 2 after the window in the top has been made and with a milling bit shown that is used to make a window in the bottom of the laminate substrate;

FIG. 7 is a sectional view of the layers of FIG. 6 with an electronic device wire bonded to the laminate substrate;

FIG. 8 is a sectional view of an alternate embodiment for the placement of an electronic device;

FIG. 9 is a sectional view of yet another alternate embodiment for the placement of an electronic device;

FIG. 10 is an exploded sectional view of the layers used to construct a multi-tier laminate substrate in accordance with another embodiment of the present invention;

FIG. 11 is a sectional view of the layers of FIG. 10 with an electronic device wire bonded to the laminate substrate;

FIG. 12 is a sectional view of the layers used to construct a multi-tier laminate substrate after being laminated together with a milling bit shown that is used to make a window in the top of the laminate substrate in accordance with another embodiment of the present invention;

FIG. 13 is a bottom plan view of the top layer of FIG. 12 before being laminated to the other layers; and FIG. 14 is a sectional view of the layers of FIG. 12 with an electronic device wire bonded to the laminate substrate.

DETAILED DESCRIPTION OF THE PREFERRED EMBODIMENTS

The present invention provides methods for producing cost-effective, high performance packages for semiconductor devices. The laminate substrates of the present invention are used for packaging semiconductor devices, such as diodes, transistors, and integrated circuits, to protect the device from environmental effects, to provide easy access to the various parts of the device by means of a lead structure such that the device can be conveniently attached to the rest of the system, and to facilitate heat transfer out from the device to the ambient environment. The evolution of semiconductor devices has been to increase device density without increasing and in some cases even reducing chip area. These high device densities have fueled the need for new and improved packaging for these devices.

It has been discovered that multi-tier semiconductor device packages produced from multi-tier laminate substrates can meet these needs, have excellent performance characteristics and can be produced in a cost-effective manner. The methods of the present invention will be described as if only one package was being produced from one set of materials. However, as one of ordinary skill in the art will recognize the layers of material can be used in large panels (e.g., 1 foot by 1.5 feet) cut from larger sheets (e.g., 3 feet by 4 feet) and that a large number of individual packages can be cut out of the large panels (commonly known as depaneling) for use individually. Further, the methods of the present invention can be used to produce laminate substrates that can be incorporated into multiple types of packages such as small outline packages, plastic leaded chip carriers, flat-pack packages, quad flat-pack packages, packages incorporating through-hole arrays, packages incorporating surface-mount arrays, etc. Likewise, the methods can be used to produce either cavity up or cavity down packages.

FIG. 1 shows an exploded view of the layers used to produce a multi-tier laminate substrate in accordance with one embodiment of the present invention. Cores 10 and 18 are preferably polyimide, bismaleimide triazene, or high temperature epoxy. These laminates are high temperature laminates. Cores 10 and 18 are prepared for lamination in a manner similar to the production of printed circuit boards. Trace 20 on the top of core 10 and a trace (not shown) on the bottom of core 18 are part of an electrical circuit. The inner traces are produced by the standard photolithographic method of photoresisting portions of the surface of the cores 10,18. Imaging the circuit into the surface. Developing and etching the circuit into the surface. Then removing the photoresist. Preferably, the outer traces on the bottom of core 10 and the top of core 18 are not formed at this time (although they can be) so that they will not be damaged during the process steps. As one of ordinary skill will recognize, other methods of producing the traces can be used. For example, x-ray and electron-beam lithography can be used particularly when very small dimensions are needed since these are much more expensive and time-consuming processes.

In one embodiment, layers 12 and 16 (FIG. 2) are dielectric layers used to prevent the inner circuits on core 10 and core 18 from shorting out during operation. Layers 12 and 16 are preferably no-flow or low flow prepreg. Basically, they are a b-stage polymer meaning that they are substantially solid but have not been fully cured or polymerized. Layers 12 and 16 of dielectric essentially act as an adhesive to hold the layers together. Standard flow prepreg is generally used in the art. However, it was discovered that no-flow or low flow prepreg is particularly advantageous. When using standard flow prepreg, it is very difficult to prevent the prepreg polymer resin from flowing onto areas that are required to be exposed as a finished substrate. Whereas, the no-flow or low flow prepreg conforms and adheres to the cores and the circuits on the cores without flowing into the areas that are to be exposed later while still offering the same thermal expansion in the x-y-z directions as the standard prepreg after the lamination cycle. While B-staged adhesive coated on film can be used, the no-flow or low flow prepreg is preferred because the b-staged adhesive coated on film does not have the same thermal expansion as the core materials.

Core 14 is a layer similar to cores 10 and 18 that is used as a spacer core in one embodiment of the present invention as shown in FIG. 2. Windows 22, 24, and 26 in layers 12, 16, and core 14 respectively are formed before all of the layers are laminated together. The windows can be formed by a number of methods as one of ordinary skill in the art will recognize. However, it has been discovered that two methods are particularly advantageous.

First, the windows can be removed with a process of micromachining or laser-based micromachining, namely ablation. There are generally three laser options: $CO_2$-based lasers with typical wavelengths of 10.6 μm; ultraviolet excimer lasers with typical wavelengths of approximately 200 to 350 nm; and Nd:YAG lasers operating at a wavelength of 266 nm. Preferably, the ablation technique is photoablation using an ultraviolet, high-power frequency-quadrupled Nd:YAG laser to remove the material in the window as shown in FIG. 3. The Nd:YAG laser 27 is a solid state laser that uses a beam 29 of ultraviolet radiation that reacts with certain materials in a process called ablative photodecomposition, or photoablation. The Nd:YAG laser 27 has advantages over the $CO_2$-based laser because the process is photochemical rather than thermal, the result is that the cut is clean and the surrounding material is largely unaffected and free of charring.

A second method consists of routing out windows in several layers of no-flow or low flow prepreg at once using a milling bit. Layers 28 of film can be interposed between individual layers 30 of no-flow or low flow prepreg as shown in FIG. 4. In another embodiment shown in FIG. 5, multiple layers or plys 30 of no-flow or low flow prepreg can be used together between layers 28 of film. The number of layers or plys 30 of no-flow or low flow prepreg between layers 28 depends on the thickness of dielectric that is desired or required for use in the laminated substrate. Typically, one, two or even three prepreg panels or plys 30 are placed between the layers of film 28. Therefore, one stack can have multiple sections of one, two or even three panels of no-flow or low flow prepreg between the layers of film during routing.

Preferably, the film 28 is release film so that the panels can be separated without damage. With the layers 28 of film between the layers 30 of no-flow prepreg, a milling bit 46 can be used to make the windows. The film helps to prevent the milling bit from becoming clogged with the no-flow prepreg as it heats up as a result of contact with the rotating bit. Likewise, film 28 helps to reduce the rough or jagged edges that are often produced and prevents layers 30 of no-flow or low flow prepreg from sticking together. The film can be any of a large variety of materials that produce desired characteristics, such as but not limited to: easy separation of the layers of no-flow prepreg; clean edges around the cut; maintains its mechanical properties at routing temperatures (above 100° C. or the glass transition temperature of dielectric or prepreg); preferably polymer-based; etc. This list is only illustrative of desired characteristics that the material can possess. Likewise, the material does not have to possess all of these characteristics. Some materials that are known to work are plastic sheeting, lamination release film, polyvinyl acetate, polyvinylfluoride film, and a highly modified polyester with acrylated epoxy sold under the tradename "PACOTHANE" (available from the Paper Corp. of the United States, Pacothane division, New York, N.Y. 10013).

In one embodiment, windows 22, 24 and 26 are made sufficiently large to expose ends or bond fingers 32 of trace 20 and the trace on the bottom of core 18 while substantially covering the remainder of the traces when the layers are laminated together as shown in FIG. 2. Bond fingers 32 are any number of bonding areas spaced around the die cavity of the package as required by the design of the package and its associated electronic device as one of ordinary skill in the art will recognizes Typical spacing allows for bonding to 4.0 mil die pad pitch.

After the windows and traces have been formed the layers are pressed or laminated together to form laminated substrate 34 shown in FIG. 2. In one embodiment, after laminated substrate 34 is formed a plurality of vias 36 are made through the laminated substrate. The vias can be made by drilling, laser micromachining (as discussed previously) or other methods recognized by those of ordinary skill in the art. The size of the vias varies depending on design requirements. The via hole diameter can range from 2 mils to 30 mils, but more typically are 12 mils in diameter. The vias and outside surfaces of cores 10 and 18 are copper plated with known techniques. Then outside surfaces 40 and 38 of cores 10 and 18, respectively, have traces formed thereon. A trace on outside surface 38 of core 18 having bond fingers 42 and a trace (not shown) on the outside surface 40 of core 10 are produced by the standard photolithographic method of photoresisting portions of the surface of cores 10,18. Imaging the circuit onto the surface. Developing and etching the circuit. Then removing the photoresist.

In one embodiment, to gain access to bond fingers 32 and the die cavity, an opening 44 is produced in core 18 by milling out the portion of the layer over the bond fingers as shown in FIG. 2. Opening 44 is not produced (although it can be) until after the vias are copper plated so that bond fingers 32 are not damaged or contaminated. Spacer core 14 is used to protect bond fingers 32 from being damaged or wiped off by milling bit 46. Spacer core 14 is of sufficient thickness to compensate for tolerances in the z-direction of the milling bit and for variations in the thickness of the cores after lamination. Typical tolerances in the z-direction for a milling machine are±2 mils. Typical tolerances in the thickness of the layers are±4 mils. Therefore, spacer layer 14 will typically be 4 to 6 mils thick, but could be any thickness necessary to compensate for variations in the material or with the machine.

In one embodiment, an opening 48 is created in core 10 to provide a location for an electronic device. Opening 48 is routed out of core 10 with milling (or routing) bit 46 as shown in FIG. 6. After openings 44 and 48 are formed, solder resist is applied to the laminated substrate so that the traces can not be shorted by metallic particles or solder. Additionally, bond fingers 32 and 42 are gold plated with standard techniques. The bond fingers are typically made to be around 0.1 mm wide by 0.5 mm long to accommodate fully the flattened ends of the bonding wires and to allow for some registration errors in the placement of the wires on the bond fingers, however, the bond fingers can be any size compatible with the size of the package and the bonding wires used.

After the bond fingers have been prepared, an electronic device is attached to the laminated substrate. Electronic device 50 is typically a chip having an integrated circuit on the top thereof (FIG. 7), but can be other active devices such as diodes, transistors, etc. Likewise, multiple chips or other devices can be attached to one laminated substrate. In one embodiment, the integrated circuit of electronic device 50 is attached to the laminated substrate by bonding wires 52 from bonding pads on the top of the chip to bond fingers 32 on one tier of the laminated substrate and by bonding wires 54 to bond fingers 42 on a second tier of the laminated substrate. The bonding wires are typically 25 micrometer diameter gold wires, however as one of ordinary skill in the art is aware various diameters and materials, such as aluminum or other metals, can be used especially for high-current-power devices.

In one embodiment, the wires are bonded to the bond fingers using a thermosonic bonding process which uses a combination of heat (approximately 150° C. to 200° C.) and ultrasonics (approximately 60 to 70 kHz) to obtain a good mechanical bond and a very low resistance electrical contact. An ultrasonic bonding process which uses just ultrasonics (approximately 60 to 70 kHz) can also be used. In the thermosonic and similar types of bonding processes, the end of the wire becomes expanded to about two to three times its original diameter; so the large bond fingers are advantageous. After the electronic device has been attached, the laminated substrate can be used in a conventional plastic package to encapsulate the electronic device. A heat sink 55 can be attached to the plastic package with known methods and is particularly advantageous to aid in convective heat transfer from the package. Heat sink 55 typically is adhesively attached to the laminated substrate. The heat sink can cover substantially all of surface 40 or can be smaller and cover only part of surface 40 depending on the heat transfer requirements of the design.

In another embodiment shown in FIG. 8 there is no opening 48, electronic device 50 is die attached to core 10. In yet another embodiment shown in FIG. 9, instead of opening 48, cavity 57 is milled into core 10 and electronic device 50 is die attached to core 10 in cavity 57. Cavity 57 can be milled in core 10 prior to lamination of the substrate or after opening 44 has been made.

The thickness of the layers and/or cores of the laminated substrate can be varied greatly depending on the design requirements for the laminated substrate. Typical thicknesses for cores 10 and 18 generally range from 3 to 40 mils, and more typically are about 5 mils thick. Core 14 generally ranges from 3 to 10 mils, and more typically is about 4 mils thick. Layers 12 and 16 generally range from 2 to 5 mils in thickness, and more typically are about 3 mils thick.

FIGS. 7-9 and 14 are examples of two tier laminated substrates. FIG. 11 is an example of a three tier laminated substrate. Laminated substrate 56 of FIG. 11 is produced by substantially the same process as laminated substrate 34 except for the addition of core 58 of high temperature laminate (such as polyimide, bismaleimide triazene, high temperature epoxy, etc.) and layer 60 of dielectric. In one embodiment, core 58 is prepared for lamination in the same manner as cores 10 and 18 such that a trace having bond fingers 62 is formed thereon.

The method of producing the three tier laminated substrate of FIG. 11 will now be described with reference to FIGS. 10 and 11. Layer 60 is a dielectric layer of the same material and used for the same purposes as layers 12 and 16. Core 14 is used as a spacer core as described above to prevent bond fingers 62 from being damaged or wiped off by the milling bit. In one embodiment, window 64 is formed in core 58 and layer 60 before all of the layers are laminated together and is made sufficiently large to expose bond fingers 32 of trace 20 while substantially covering the remainder of the trace when the layers are laminated together as shown in FIG. 11. Windows 22, 24, and 26 in layers 12, 16, and core 14 respectively are also formed before all of the layers are laminated together. Windows 22, 24 and 26 are made sufficiently large to expose bond fingers 62 while substantially covering the remainder of the trace when the layers are laminated together as shown in FIG. 11. The windows can be formed by any of the methods previously discussed or by a variety of other methods as one of ordinary skill in the art will recognize.

In one embodiment, after the windows and traces have been formed, cores 10, 58 and layer 60 are pressed or laminated together (FIG. 10). These three layers are preferably laminated together first to ensure a good bond between core 10 and layer 60 and layer 60 and core 58 near the bond fingers 32 so that the panel does not tend to delaminate in that area. Then all of the layers are pressed or laminated together to form laminated substrate 56 shown in FIG. 11. In another embodiment, all of the layers can be pressed or laminated together to form laminated substrate 56 after the windows and traces have been formed. After laminated substrate 56 is formed, in one embodiment, a plurality of vias 36 are made through the laminated substrate and copper plated as discussed above. Then outside surfaces 40 and 38 of cores 10 and 18, respectively, have traces formed thereon in the same or similar manner as discussed previously.

To gain access to bond fingers 32 and 62 in the die cavity, an opening 44 is produced in core 18. In one embodiment, opening 44 is produced by milling out the portion of the layer over the bond fingers as discussed previously. Preferably, opening 44 is not produced (although it can be) until after the vias are copper plated so that bond fingers 32 and 62 are not damaged or contaminated. Spacer core 14 is used to protect bond fingers 62 from being damaged or wiped off by the milling bit when opening 44 is produced. Spacer core 14 is of sufficient thickness to compensate for tolerances in the z-direction of the milling bit and for variations in the thickness of the layers as discussed above. Opening 44 can also be formed by the micromachining techniques discussed above.

An opening 48 is created in core 10 to provide a location for an electronic device. In one embodiment, opening 48 is routed out of core 10 with a milling bit 46 in the same manner as discussed previously. After openings 44 and 48 are formed, the laminated substrate is solder resisted so that the traces can not be shorted by metallic particles or solder. Additionally, bond fingers 32, 42 and 62 are gold plated with standard techniques. After the bond fingers have been prepared, an electronic device is attached to the laminated substrate as disclosed previously. In one embodiment, the integrated circuit is wirebonded from pads on the top of the chip to bond fingers 32 on one tier of the laminated substrate with wires 52, to bond fingers 62 with wires 66 on a second tier of the laminated substrate, and to bond fingers 42 on a third tier of the laminated substrate with wires 54. The wires are bonded to the bond fingers using any of the thermosonic, thermocompression, or other known techniques discussed above. Thereafter, the laminated substrate can be used in a conventional plastic package to encapsulate the electronic device. Likewise, heat sink 55 can be attached to the plastic package with known methods and is particularly advantageous to aid in convective heat transfer from the package. Electronic device 50 can also be attached directly to core 10 as discussed above.

FIGS. 12–14 illustrate another embodiment for producing a two tier laminated substrate. Laminated substrate 68 of FIG. 14 is produced by substantially the same process as laminated substrate 34 except that clearance ring 70 (FIG. 13) in core 72 is used in place of spacing core 14 to protect bond fingers 32. In one embodiment, core 72 is prepared for lamination in the same manner as discussed previously with respect to cores 10 and 18 such that a trace having bond fingers 42 is formed thereon. However, core 72 is thicker than core 18 used in the earlier embodiment so that clearance ring 70 can be routed into the bottom surface of core 72 before all the layers are assembled together.

Clearance ring 70 and the additional thickness of core 72 are used as a spacer (in place of core 14) to prevent bond fingers 32 from being damaged or wiped off by milling bit 46. In one embodiment, the clearance ring is milled in a path that corresponds to a path over bond fingers 32 spaced around the die cavity periphery. The clearance ring can be formed by a number of methods as one of ordinary skill in the art will recognize, but preferably is milled with a milling bit (or routing bit) so that control can be maintained in the z-direction.

In one embodiment, after the clearance ring and traces on the inner layers have been formed the cores and layers are pressed or laminated together to form laminated substrate 68 shown in FIG. 12. After laminated substrate 68 is formed, a plurality of vias 36 are made and plated as described previously. Then outside surfaces 40 and 38 of cores 10 and 72, respectively, have traces formed thereon. A trace on outside surface 38 of core 72 having bond fingers 42 and a trace (not shown) on the outside surface 40 of core 10 are produced by the standard photolithographic process or other known processes.

To gain access to bond fingers 32 in the die cavity, an opening 44 is produced in core 72. In one embodiment, opening 44 is produced by milling out the portion of the layer over the bond fingers by tracing milling bit 46 along the path of clearance ring 70. Preferably, opening 44 is not produced (although it can be) until after the vias are copper plated so that bond fingers 32 are not damaged or contaminated. Clearance ring 70 is of sufficient depth that opening 44 can be formed with milling bit 46 without having to extend the end of the milling bit into proximity of bond fingers 32. In this way, clearance ring 70 can be used to compensate for tolerances in the z-direction of the milling bit and for variations in the thickness of the layers and cores. Typical tolerances in the z-direction for a milling machine are±2 mils. Typical tolerances in the thickness of the cores are±4 mils. Therefore, core 72 will typically be about 4 to 6 mils thicker than previously used core 18. The laminated substrate 68 is completed with the attachment of an electronic device as discussed previously and prepared for use in a conventional plastic package to encapsulate the electronic device. Likewise, heat sink 55 can be attached to the plastic package with known methods and is particularly advantageous to aid in convective heat transfer from the package.

The methods of the present invention can be used to produce multi-tier laminated substrates such as those discussed. In addition, as one of ordinary skill in the art will recognize, an unlimited variety of substrates such as four tier, five tier, etc. can be produced with the methods of the present invention. In addition, different trace-producing methods can be used. Likewise, the steps of the present invention can be varied in their chronological order. For example, the solder resist can be applied before routing the opening(s) in the outer core (and inner cores). The advantage of applying the solder mask before routing the openings is that a curtain coating process can be used, which is a lower cost process. Other examples of variations include, but are not limited to: treating the exposed surfaces of the laminating layers before lamination, such as gold plating the inner layer before lamination; black oxide treating of the copper surfaces to promote adhesion to the dielectric; applying solder mask for other technical reasons; and many other mechanical surface treatments recognized by one of ordinary skill in the art.

The foregoing has described the principles, preferred embodiments and modes of operation of the present invention. However, the invention should not be construed as being limited to the particular embodiments discussed. Thus, the above-described embodiments should be regarded as illustrative rather than restrictive, and it should be appreciated that variations may be made other than those discussed by workers of ordinary skill in the art without departing from the scope of the present invention as defined by the following claims.

The invention claimed is:

1. A method for making multi-tier laminate substrates for electronic device packaging comprising the steps of:

providing a first laminating layer having a trace on a first side and a second laminating layer having a trace on a first side;

making an annular depression in the first side of the first laminating layer;

making a first window corresponding to the annular depression in at least one layer of dielectric;

laminating together the first laminating layer, the second laminating layer, and the layer of dielectric to produce a laminated substrate, wherein the layer of dielectric is located between the trace on the first side of the first laminating layer and the trace on the first side of the second laminating layer;

making vias through the laminated substrate;

plating the vias;

producing traces on a second side of the first laminating layer and a second side of the second laminating layer;

making a first opening in the first laminating layer corresponding to the annular depression; and treating exposed surfaces of the laminating layers.

2. The method of claim 1 wherein the annular depression is produced by milling.

3. The method of claim 1 wherein the first opening is produced by milling the first laminating layer over the annular depression so as to not damage the trace on the first side of the second laminating layer.

4. The method of claim 1 further comprising:

making a second opening in the second laminating layer of sufficient size to locate an electronic device therein.

5. The method of claim 4 wherein the first window and second opening are produced by photoablation.

6. The method of claim 4 wherein the first window and second opening are produced by routing.

7. The method of claim 1 wherein the first opening is produced by ablating the first laminating layer over the annular depression so as to not damage the trace on the first side of the second laminating layer.

8. The method of claim 1 wherein the treating step comprises:

solder masking the desired exposed surfaces;

gold plating the traces on the second side of the first laminating layer and the first side of the second laminating layer.

9. The method of claim 1 wherein the treating step comrprises:

solder masking the desired exposed surfaces before making the first opening; and gold plating the traces on the second side of the first laminating layer and the first side of the second laminating layer.

10. The method of claim 1 wherein the first window and the annular depression are made before laminating the layers together.

11. The method of claim 1 wherein the treating step is performed before lamination.

12. The method of claim 1 further comprising:

making a second window in a third laminating layer having traces on a first side and a second side; and wherein the third laminating layer is located between the layer of dielectric contacting the trace on the first side of the second laminating layer and a layer of dielectric contacting the first side of the first laminating layer.

13. The method of claim 12 wherein the third laminating layer, the second laminating layer and the dielectric between them are laminated together before forming the laminated substrate.

14. The method of claim 1 wherein the first opening are made after the traces on the second side of the first laminating layer and the second side of the second laminating layer so that the traces on the first side of the first laminating layer and the first side of the second laminating layer will be protected.

15. The method of claim 1 wherein the dielectric is unsupported B-staged film or prepreg film-coated with B-staged adhesive.

* * * * *